US010925146B1

(12) United States Patent
Ryan et al.

(10) Patent No.: US 10,925,146 B1
(45) Date of Patent: Feb. 16, 2021

(54) ION SOURCE CHAMBER WITH EMBEDDED HEATER

(71) Applicant: Applied Materials, Inc., Santa Clara, CA (US)

(72) Inventors: Kevin Ryan, Gloucester, MA (US); Todd MacEachern, Gloucester, MA (US); Jeffrey Krampert, Gloucester, MA (US); Joseph Dzengeleski, Gloucester, MA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 16/717,225

(22) Filed: Dec. 17, 2019

(51) Int. Cl.
*H01J 37/32* (2006.01)
*H05H 1/46* (2006.01)

(52) U.S. Cl.
CPC ....... *H05H 1/46* (2013.01); *H05H 2001/4645* (2013.01)

(58) Field of Classification Search
CPC ........... H01J 37/32321; H01J 37/32532; H01J 37/32715; H01J 37/3405; H01J 37/3447
USPC .......................................... 315/111.21, 111.8
See application file for complete search history.

(56) References Cited

U.S. PATENT DOCUMENTS 5,798,016 A 8/1998 Oehrlein et al.
5,837,094 A * 11/1998 Tsukazaki ......... H01L 21/67253 156/345.25
5,933,752 A * 8/1999 Yanagida ................ H01L 24/03 438/613
6,201,219 B1 * 3/2001 Sandhu ................. C23C 14/564 118/724
6,227,140 B1 5/2001 Kennedy et al.
6,744,017 B2 6/2004 Leavitt et al.
8,809,800 B2 8/2014 Koo et al.
2003/0147075 A1 * 8/2003 Otsuki .............. H01L 21/67253 356/338
2012/0225566 A1 * 9/2012 Hamano ............. H01L 21/0262 438/765
2017/0069463 A1 * 3/2017 Kang .................. H01J 37/3244
2017/0092502 A1 * 3/2017 Mebarki ........... H01L 21/02532
2019/0094697 A1 * 3/2019 Wang ................ H01L 21/67225
2020/0185554 A1 * 6/2020 Choi ....................... H02S 40/22

* cited by examiner

*Primary Examiner* — Tung X Le
(74) *Attorney, Agent, or Firm* — Nields, Lemack & Frame, LLC

(57) ABSTRACT

An ion source chamber with an embedded heater is disclosed. The heater comprises a radiant heater, such as a heat lamp or light emitting diodes, and is disposed within the ion source chamber. The radiant heat from the heater warms the interior surfaces of the ion source chamber. Further, the ion source chamber is designed such that the plasma is generated in a portion of the ion source chamber that does not contain the heater. Additionally, a controller may be in communication with the heater so as to maintain the ion source chamber at a desired temperature when a plasma is not being generated in the ion source chamber.

19 Claims, 7 Drawing Sheets

ION SOURCE CHAMBER WITH EMBEDDED HEATER

FIELD

Embodiments of the present disclosure relate to an ion source chamber with an embedded heater.

BACKGROUND

The fabrication of a semiconductor device involves a plurality of discrete and complex processes. In certain processes, it may be advantageous to perform one or more of these processes at elevated temperatures.

For example, within an ion source, different gasses may be best ionized at different temperatures. Larger molecules are preferably ionized at lower temperatures to ensure that larger molecular ions are created. Other species may be best ionized at higher temperatures. These elevated temperatures may be achieved through the use of heaters. Often, the heaters are disposed outside the ion source chamber and heat the chamber from the outside.

When a process that utilizes an elevated temperature is initiated, the ion source chamber may take some amount of time to reach the desired temperature. Consequently, there are two options available to the operator. First, throughput may be sacrificed while waiting for the ion source chamber to reach this desired temperature. Second, quality may be sacrificed by operating the ion source chamber before it reaches the desired temperature.

Obviously, neither of these options is ideal. Further, this may occur in other situations. For example, if the ion source is used for one dopant at a first temperature, and is then to be used for a different dopant at a higher temperature, the operator is again faced with these options.

Therefore, it would be advantageous if there were an ion source chamber that could be brought quickly to temperature. It would be beneficial if this ion source chamber could be maintained at a desired temperature, even when a plasma is not being created.

SUMMARY

An ion source chamber with an embedded heater is disclosed. The heater comprises a radiant heater, such as a heat lamp or light emitting diodes, and is disposed within the ion source chamber. The radiant heat from the heater warms the interior surfaces of the ion source chamber. Further, the ion source chamber may be designed such that the plasma is generated in a portion of the ion source chamber that does not contain the heater. Additionally, a controller may be in communication with the heater so as to maintain the ion source chamber at a desired temperature when a plasma is not being generated in the ion source chamber.

According to one embodiment, an ion source chamber is disclosed. The ion source chamber comprises a face plate having an extraction aperture; a rear plate, opposite the face plate; walls connecting the face plate and the rear plate, the face plate, the rear plate and the walls defining an enclosed volume; and a heater disposed in the enclosed volume, wherein radiant heat from the heater heats an interior surface of the enclosed volume. In certain embodiments, the heater comprises one or more heat lamps. In certain embodiments, the heater comprises a plurality of LEDs. In some embodiments, the ion source chamber further comprises brackets affixed to the rear plate to hold the heater. In some embodiments, a heater power supply is provided and electrical connections from the heater power supply pass through the rear plate and to the heater. In certain embodiments, the brackets comprise an internal channel, and a coolant distribution system is provided, wherein coolant from the coolant distribution system passes through the rear plate and into the internal channel to cool the bracket. In certain embodiments, the ion source chamber further comprises one or more coils disposed on a portion of an exterior of the walls; and an RF power supply in communication with the one or more coils to generate a plasma within the enclosed volume, wherein the enclosed volume that is surrounded by the one or more coils defines a plasma generation region, and the heater is not disposed in the plasma generation region.

According to another embodiment, an ion source chamber is disclosed. The ion source chamber comprises a face plate having an extraction aperture; a rear plate, opposite the face plate; walls connecting the face plate and the rear plate, the face plate, the rear plate and the walls defining an enclosed volume; brackets extending from the rear plate into the enclosed volume; an outer tube, wherein the outer tube is hollow and disposed between the brackets, and an interior of the outer tube is isolated from the enclosed volume; and a heater disposed in the outer tube, wherein radiant heat from the heater heats an interior surface of the enclosed volume. In certain embodiments, the heater comprises one or more heat lamps. In certain embodiments, the heater comprises a plurality of LEDs. In some embodiments, the outer tube comprises sapphire or quartz. In certain embodiments, a blower is provided, wherein the brackets comprise internal air channels to route air or another gas from the blower to the interior of the outer tube to cool the heater. In certain embodiments, air or another gas is blown into both ends of the outer tube to create turbulent flow. In some embodiments, the ion source chamber further comprises a blocker disposed within the outer tube to block the direct path of the infrared energy from the heater to the extraction aperture. In certain embodiments, a fluid conduit is provided within the outer tube and extends between the brackets, and a coolant distribution system is provided, wherein coolant from the coolant distribution system passes through the rear plate and through the fluid conduit within the outer tube.

According to another embodiment, an ion source chamber is disclosed. The ion source chamber comprises a face plate having an extraction aperture; a rear plate, opposite the face plate; walls connecting the face plate and the rear plate, the face plate, the rear plate and the walls defining an enclosed volume; brackets extending from the rear plate; a heater disposed between the two brackets, wherein the heaters emit energy at wavelengths between 0 μm and 10 μm. In certain embodiments, liners are disposed in the enclosed volume, the liners having an interior surface facing the enclosed volume and an exterior surface facing the walls, wherein energy from the heater heats the interior surface of the liners. In certain embodiments, the heater comprises one or more heat lamps. In certain embodiments, the heater comprises a plurality of LEDs. In some embodiments, the plurality of LEDs are angled toward an interior surface of the enclosed volume.

BRIEF DESCRIPTION OF THE FIGURES

For a better understanding of the present disclosure, reference is made to the accompanying drawings, which are incorporated herein by reference and in which.

DETAILED DESCRIPTION

As described above, in certain embodiments, it is beneficial to operate an ion source chamber at an elevated temperature. Typically, this may be accomplished by creating a plasma within the ion source chamber and waiting until the energy from the plasma heats the ion source chamber to the desired temperature. However, this may be time consuming.

Figure 1:
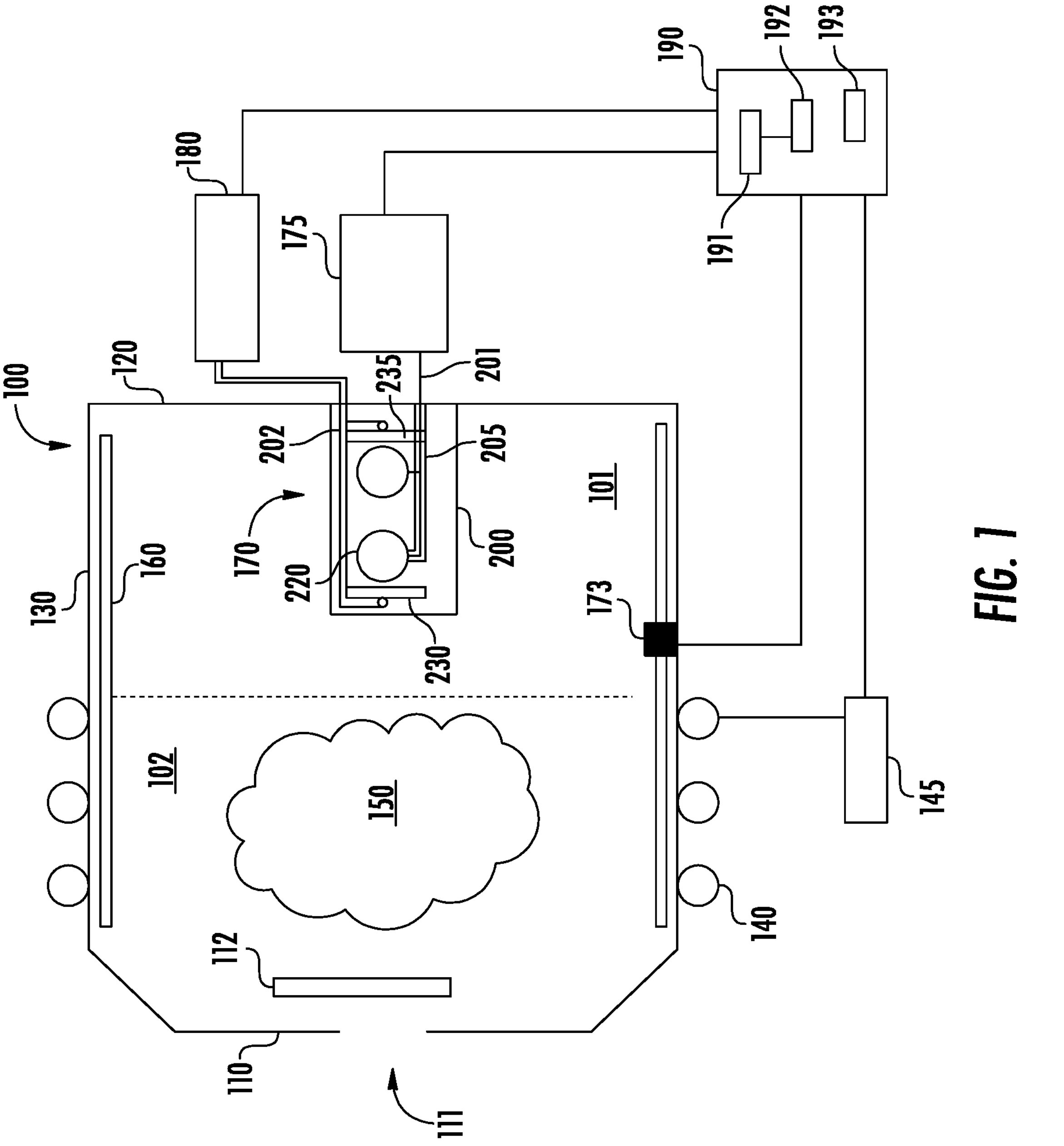
FIG. 1 shows an ion source chamber with the embedded heater according to one embodiment.

FIG. 1 shows an ion source chamber with an embedded heater according to one embodiment. In this embodiment, the ion source chamber 100 comprises a face plate 110, which has an extraction aperture 111. The extraction aperture may be rectangular or oval shaped, with one dimension longer than the second dimension. The ion source chamber 100 also has a rear plate 120, through which many of the electrical and fluid connections may be created. The ion source chamber 100 also has a plurality of walls 130, which, along with the face plate 110 and the rear plate 120, defines an enclosed volume 101 in which the plasma 150 is created. In certain embodiments, there may be four or more walls 130.

In certain embodiments, a plasma sheath modifier 112 may be disposed within the enclosed volume 101, proximate to the extraction aperture 111. The plasma sheath modifier 112 may be used to manipulate the angle at which ions exiting the ion source chamber 100.

One or more coils 140 may be disposed around the exterior surfaces of the walls 130. In one embodiment, the one or more coils 140 wrap around a portion of the perimeter of the ion source chamber 100. In another embodiment, the one or more coils 140 may be disposed on only a portion of the walls 130. For example, the one or more coils 140 may be disposed proximate the top and bottom walls, but not along the two side walls. In this embodiment, the top and bottom walls are defined as those two walls that are parallel to the longer dimension of the extraction aperture 111. The two side walls are defined as the walls that are perpendicular to the longer dimension of the extraction aperture 111.

As shown in FIG. 1, in certain embodiments, the one or more coils 140 are only disposed on a portion of the walls 130. For example, the one or more coils 140 may be disposed on portions of the walls 130 that are proximate the face plate 110, while not being disposed on portions of the walls 130 that are proximate the rear plate 120. In certain embodiments, the portion of the walls 130 that are disposed proximate the one or more coils 140 may be constructed of a dielectric material to improve the transfer of energy into the ion source chamber 100. The remaining portion of the walls may be constructed of anodized aluminum or another suitable material. In certain embodiments, a liner may be disposed inside the ion source chamber 100 proximate the walls. This configuration may help confine the plasma 150 near the extraction aperture 111.

The one or more coils 140 may be in communication with a RF power supply 145. The RF power supply supplies a radio frequency electrical output to the one or more coils 140. The electrical output may be at a frequency of, for example, 2 MHz or more. This electrical output creates an electromagnetic field and creates a plasma when a feed gas is supplied to the enclosed volume 101.

While the disclosure describes the use of one or more coils 140, it is understood that other types of plasma generators may be utilized, including inductively coupled plasma generators, inductively coupled plasma generators, indirectly heated cathodes, and other suitable devices.

In certain embodiments, a liner 160 may be disposed proximate the interior surfaces of the walls 130. This liner 160 may be graphite or another suitable material and are used to protect the interior surface of the walls 130 from the harsh environment created by the plasma 150. In certain embodiments, the liner 160 comprises a plurality of separate pieces that are each disposed against a respective wall 130. The liner 160 may each comprise a thin sheet having an interior surface that faces and in direct communication with the enclosed volume 101, and an exterior surface that faces the wall 130 of the ion source chamber 100.

Also disposed in the enclosed volume 101 is the heater 170. The heater 170 may be in communication with a heater power supply 175. In certain embodiments, the electrical connections from the heater power supply 175 to the heater 170 pass through the rear plate 120. In certain embodiments, the heater 170 is disposed in a region of the enclosed volume 101 that is separate from where the plasma 150 is created. For example, as described above, the one or more coils 140 may be disposed on a portion of the walls 130. The portion of the enclosed volume 101 that is bounded by the one or more coils 140 on at least one side may be referred as the plasma generation region 102. The heater 170 may be disposed in the portion of the enclosed volume 101 that is not surrounded by the one or more coils. Thus, although there may be plasma near the heater 170, it is less energetic than that generated in the plasma generation region 102. Note that the heater is not disposed behind a liner and is not part of a wall of the ion source chamber 100. Rather, the heater 170 is embedded within the enclosed volume 101 and heats the interior surfaces of the enclosed volume 101.

A temperature sensor 173 may be used to measure the temperature of the interior surface of the walls 130. In certain embodiments, this temperature sensor 173 may be an infrared sensor that measures the temperature by determining the infrared energy emitted by the interior surface. In other embodiments, the temperature sensor 173 may be a thermocouple.

In embodiments where liners 160 are employed, the temperature sensor 173 may be used to measure the temperature of the surface of the liner 160. Additional temperature sensors, such as infrared sensors, may be used to measure a temperature of the plasma sheath modifier 112 and the face plate 110 near the extraction aperture 111.

Throughout this disclosure, the term "interior surface" is used to refer to the surface of the component (either the liner 160 or the wall 130) that is facing and in direct communication with the enclosed volume 101.

Since the heater 170 is disposed within the enclosed volume 101, it serves to heat the interior surfaces of the enclosed volume 101. Thus, unlike other heaters that heat the ion source chamber by heating an exterior surface, the present heater is more efficient as it is actually heating the interior surfaces of the ion source chamber 100. This may be possible because the heater 170 is disposed within the enclosed volume 101, but may be outside the plasma generation region 102.

Additionally, in certain embodiments, a coolant distribution system 180 may be employed. The coolant distribution system 180 may include a pump, a cooler or chiller, and conduits or pipes that flow to and from the heater 170.

A controller 190 may be in communication with the heater power supply 175 and the temperature sensor 173. In certain embodiments, the controller 190 is also in communication with the RF power supply 145. The controller 190 may include a processing unit 191, such as a microcontroller, a personal computer, a special purpose controller, or another suitable processing unit. The controller 190 may also include a non-transitory storage element 192, such as a semiconductor memory, a magnetic memory, or another suitable memory. This non-transitory storage element 192 may contain instructions and other data that allows the controller 190 to perform the functions described herein.

In one embodiment, the controller 190 also comprises an input device 193. This input device 193 may be a keyboard, touchscreen or other suitable device.

Figure 5:
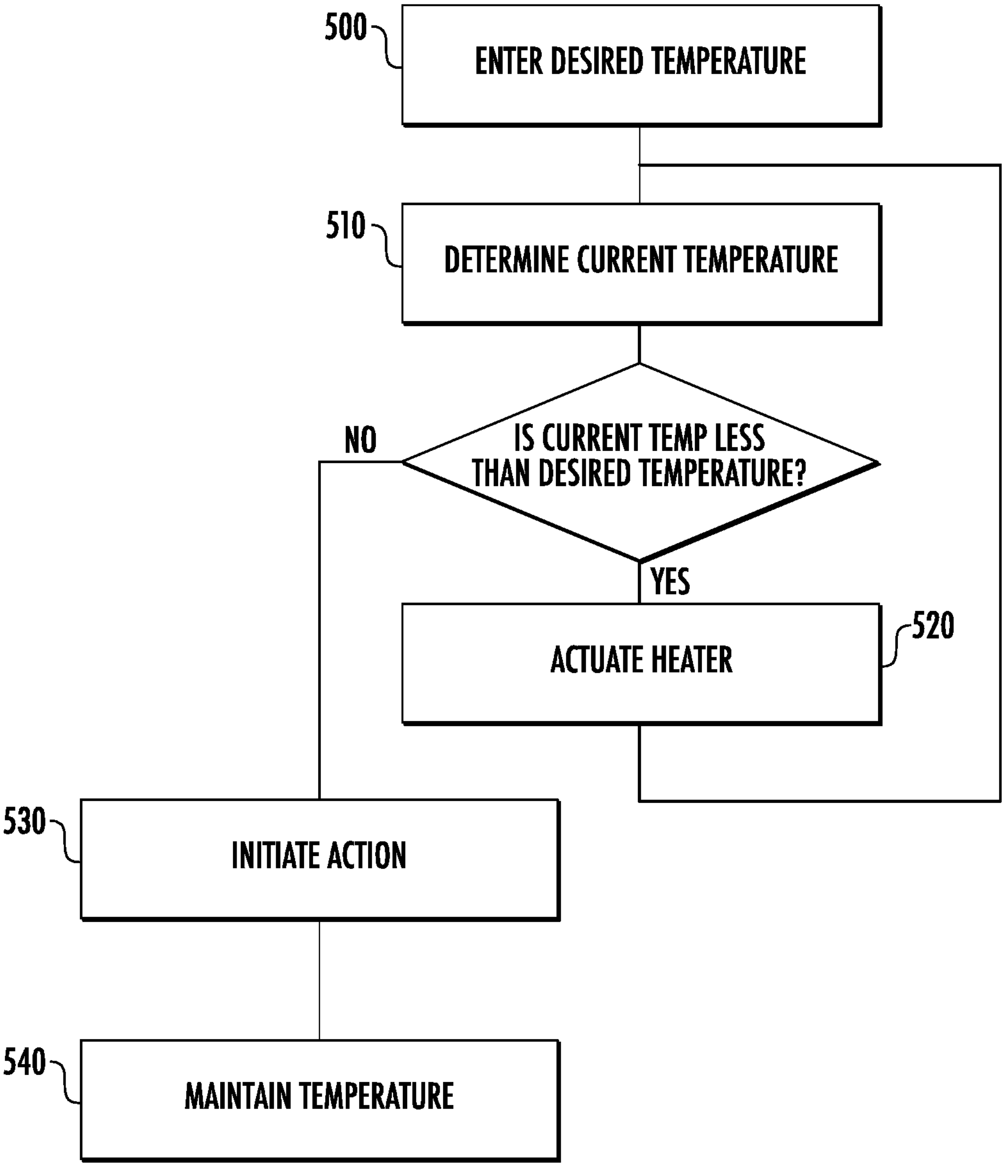
FIG. 5 shows the operation of the ion source chamber according to one embodiment.

The operation of the ion source chamber is shown in FIG. 5. In operation, the operator may determine that a particular process may be best performed at an elevated temperature. As shown in Box 500, the operator may enter the desired temperature into the controller 190, such as by using the input device 193. In response, the controller 190 may determine the current temperature of the ion source chamber 100, such as by monitoring the temperature sensor 173, as shown in Box 510. If the actual temperature of the ion source chamber 100 is less than the desired temperature, the controller 190 may actuate the heater power supply 175, as shown in Box 520. This will actuate the heater 170, which provides radiant heating to the interior surfaces of the enclosed volume 101. When the monitoring temperature reaches the desired temperature, the controller 190 may initiate an action, as shown in Box 530.

For example, the controller 190 may provide an alert to the operation, indicating that the ion source chamber 100 is ready for operation.

Once the ion source chamber 100 reaches the desired temperature, it may be utilized to generate ions. Thus, in another embodiment, the controller 190 may begin the flow of feedgas into the ion source chamber 100 and generate a plasma 150 by actuating the RF power supply 145. In certain embodiments, the controller 190 may disable the heater 170 when the RF power supply 145 is actuated.

In certain embodiments, the controller 190 operates the coolant distribution system 180 whenever the heater power supply 175 is active. In some embodiments, the coolant distribution system 180 may be independently operated to maintain the temperature of the heater 170 within a predetermined range. In this embodiment, there may be a temperature sensor to measure the temperature of the heater 170.

After initiating an action, the controller 190 may maintain the ion source chamber at the desired temperature until the operator provides a new command, as shown in Box 540. For example, the controller 190 may vary the current passing through the tungsten filaments to adjust the amount of heat that is radiated by the heater 170. In another embodiment, the controller 190 may cycle the heater power supply 175 to maintain the temperature of the ion source chamber 100. This may be done by continuously monitoring the temperature sensor 173. Temperature sensor 173 may provide an indication of the temperature of the interior surfaces of the walls 130. Based on the temperature, the controller 190 may vary the amount and/or duty cycle of the current flowing through the heater 170. The duration of this maintenance state (Box 540) is not limited by this disclosure.

Furthermore, in certain embodiments, after the processing of a batch of workpieces, the ion source chamber 100 may not be needed for some duration of time. However, if the next operation is to be performed at the current temperature or a higher temperature, the controller 190 may actuate the heater 170 to maintain the temperature of the ion source chamber 100, even while the plasma is not being generated.

Thus, in certain embodiments, the actuation of the heater 170 and the creation of a plasma 150 may be mutually exclusive operations, such that both are not occurring at the same time.

However, in other embodiments, the heater 170 may be actuated while a plasma 150 is being generated in the ion source chamber. In certain embodiments, capacitors are added to filter the RF energy from the power being supplied to the heater 170.

Figure 2A:
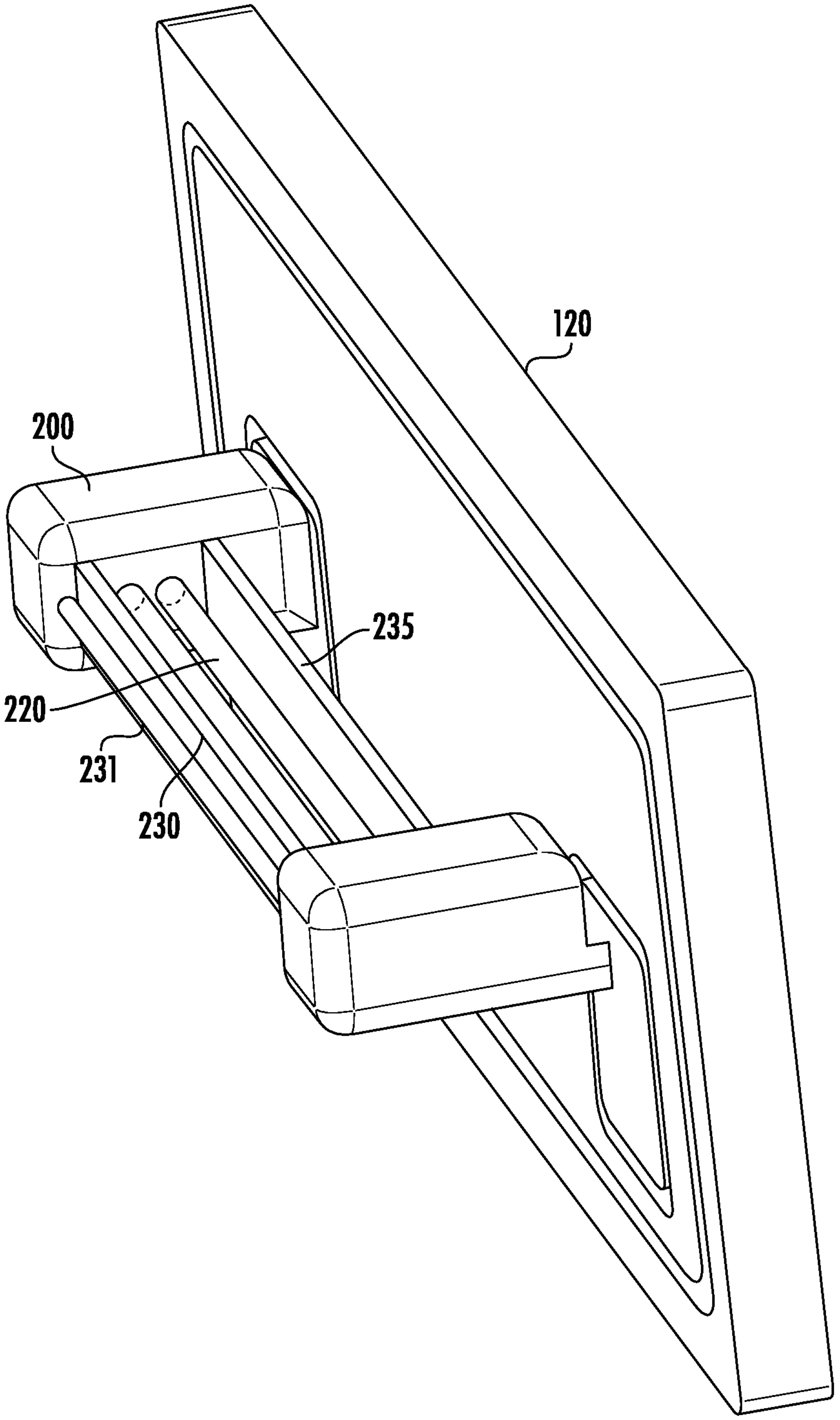
FIG. 2A shows the heater assembly used with the embodiment of FIG. 1.
Figure 2B:
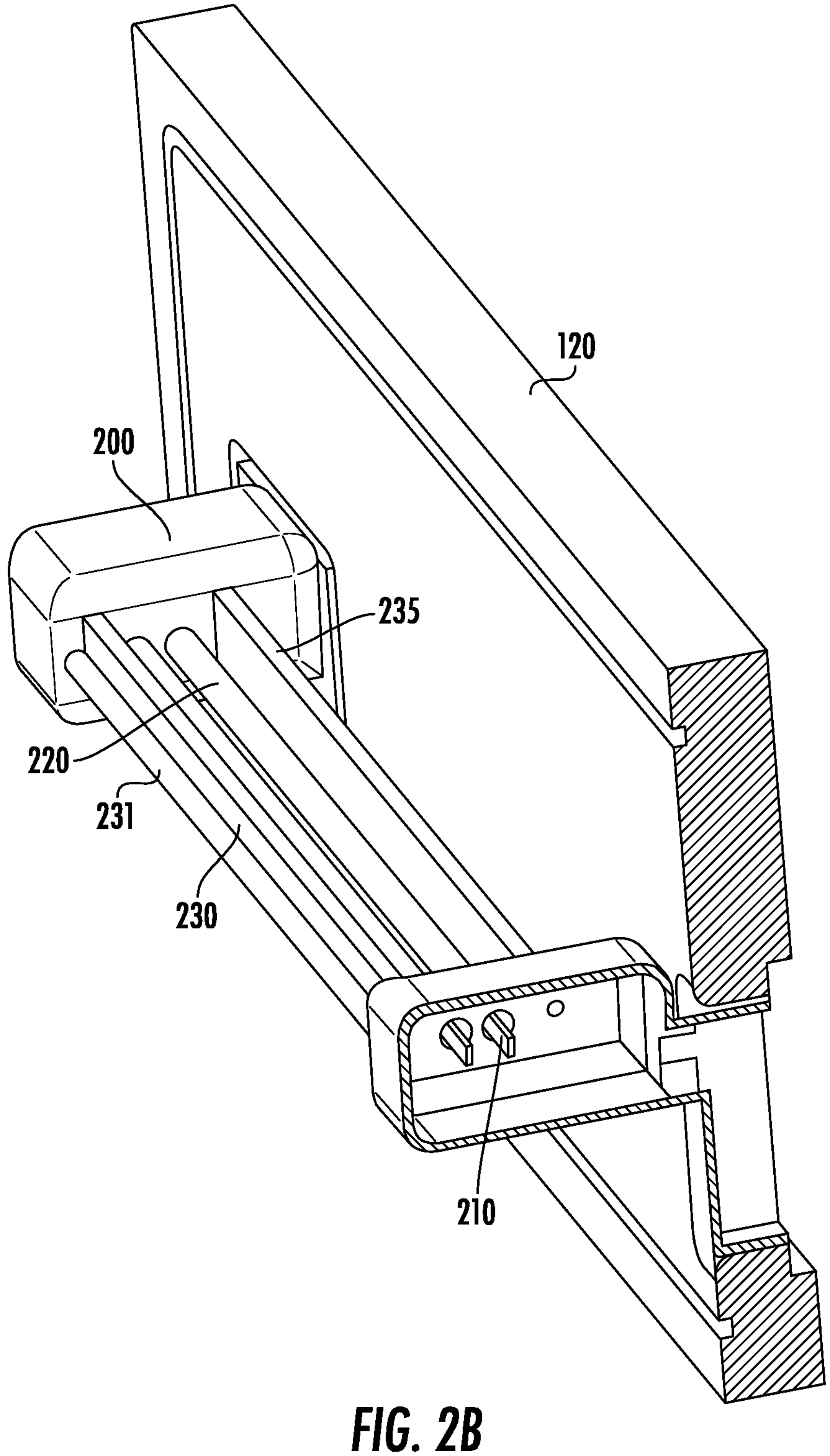
FIG. 2B shows a perspective view of the heater assembly of FIG. 2A with the brackets exposed to show the heat lamps.

FIG. 2A shows a detailed illustration of the heater used the ion source chamber of FIG. 1. FIG. 2B shows the heater of FIG. 2A with one of the brackets 200 removed. In this embodiment, the heater 170 may comprise one or more heat lamps 220. The heat lamps 220 may each comprise a tungsten filament disposed in a glass tube. A halogen gas may also be disposed in the glass tube. When energized, the heat lamps 220 may emit infrared energy at wavelengths between 0 μm and 10 μm. In some embodiments, the heat lamps 220 emit energy at wavelengths between 0.39 and 8.0 μm. In certain embodiments, the heat lamps 220 are each capable of providing at least 2 kW of energy.

In this embodiment, there are two brackets 200 that are attached to the rear plate 120. These two brackets 200 are spaced apart by a distance that is roughly equal to the length of the heat lamps 220. In certain embodiments, this may be 10 to 12 inches.

In another embodiment, the two brackets 200 may be connected to a backplate that is then attached to the interior surface of the rear plate 120.

In certain embodiments, the brackets 200 may be constructed from a material that can withstand the conditions within the ion source chamber 100. For example, the brackets 200 may be constructed of anodized aluminum with a coating to resist fluorine and other corrosive components in the plasma environment. The brackets 200 may alternatively be constructed of ceramic with a coating.

In certain embodiments, the brackets 200 may comprise an interior, isolated from the enclosed volume 101. This interior may include an internal conduit 205 (see FIG. 1) through which the electrical connections 201 from the heater power supply 175 may pass. This internal conduit 205 may minimize the exposure of the electrical connections 201 to the harsh conditions within the ion source chamber 100. Further, the brackets 200 may be grounded to the rear plate 120. In certain embodiments, the heat lamps 220 are arranged in parallel such that a voltage is supplied to one end of all of the heat lamps 220, while the opposite end of the heat lamps 220 is grounded. In other words, in certain embodiments, a positive voltage from the heater power supply 175 may be provided to one of the two brackets 200, while a ground connection may be supplied to the second of the two brackets 200. In certain embodiments, the heat lamps 220 may be independently controlled, such that a separate voltage is applied to each heat lamp 220. In this embodiment, a plurality of electrical connections 201 may pass to the bracket 200 to allow each heat lamp 220 to be individually powered. To reduce the effect of the RF energy in the plasma, a capacitive filter may be disposed at one or both ends of each heat lamp 220.

As best seen in FIG. 2B, the brackets 200 may each include one or more openings 210 on their inner sides. A first end of a heat lamp 220 may be disposed in an opening 210 of one bracket and the second end of the heat lamp 220 is disposed in the corresponding opening 210 in the other bracket. Further, the electrical connections 201 are routed inside the brackets 200 to these openings 210 to provide power and ground to the heat lamps 220. In this configuration, the ends of the heat lamps 220 are not exposed to the plasma.

In certain embodiments, the brackets 200 may also hold a blocker 230 disposed forward from the heat lamps 220. This blocker 230 may be made of a ceramic material and blocks the direct path of the infrared energy from the heat lamps 220 to the extraction aperture 111 and the plasma sheath modifier 112. In certain embodiments, a second blocker 235 may be disposed behind the heat lamps 220 to block the direct path of infrared energy from the heat lamps 220 to the rear plate 120. This second blocker 235 may also serve to reflect the infrared energy toward the interior of the enclosed volume 101. The brackets 200 may be used to hold the second blocker 235 as well.

In certain embodiments, the brackets 200 may have internal channels 202 (see FIG. 1) through which coolant fluid may pass. The coolant fluid may be deionized water, although other fluids may be used. These internal channels 202 may be in communication with the coolant distribution system 180. The connections for the coolant fluid may also pass through the rear plate 120. This coolant serves to reduce the temperature of the brackets 200, which in turn reduces the temperature of the heat lamps.

In certain embodiments, as best seen in FIG. 2B, a fluid conduit 231 extends between the two brackets 200 such that coolant fluid flows from one bracket 200 to the other bracket. This fluid conduit 231 may be proximate to the blocker 230 so as to remove heat from the blocker 230. In certain embodiments, a second fluid conduit may be disposed proximate to the second blocker 235. The coolant fluid may flow from the coolant distribution system 180, through the rear plate 120, through the bracket 200 and to the fluid conduit 231.

Figure 3:
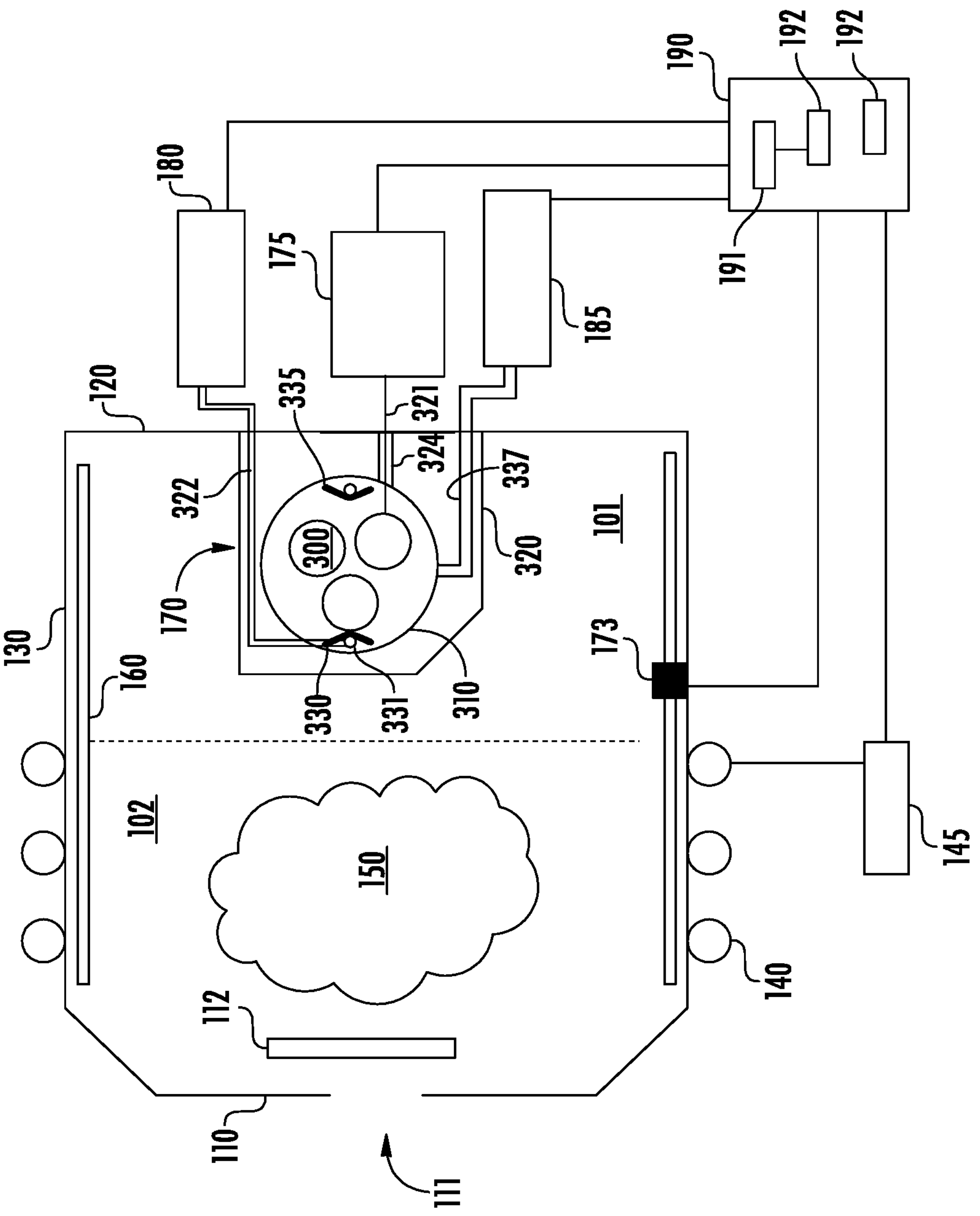
FIG. 3 shows an ion source chamber with the embedded heater according to a second embodiment.

FIG. 3 shows another embodiment of the ion source chamber 100 with an embedded heater 170. Like components have been given identical reference designators and are not described again. In this embodiment, the heater 170 comprises a plurality of heat lamps 300, which are encased in an outer tube 310. The outer tube 310, which is hollow, may be constructed by sapphire or quartz. Sapphire is about 85% transparent to short wave (SW) and medium wave (MW) infrared wavelengths. The transparency decreases to 0 at long wave (LW) infrared. Fused Silica is ~90% transparent to SW and MW infrared wavelengths and the transparency decreases to 0 at the LW infrared. Other materials that are transparent or nearly transparent at at least certain infrared frequencies may also be used. The term “nearly transparent” means that at least 70% of the energy at the desired wavelength is transmitted through the material. Thus, most of the energy (i.e. more than 70%) emitted by the heat lamps 300 at wavelengths less than 5 μm passes through the outer tube 310. In certain embodiments, more than 80% of the energy emitted by the heat lamps 300 at wavelengths between 0.71 μm and 5 μm passes through the outer tube 310. The interior of the outer tube 310 is isolated from the enclosed volume 101. In other words, in certain embodiments, air or some other gas may flow through the outer tube 310 without contaminating the enclosed volume 101.

In certain embodiments, the heat lamps 300 each may have a diameter of about 0.35 inches and the outer tube 310 may have a diameter of 1.25 to 2.0 inches, depending on the number of heat lamps 300 that are to be disposed in the outer tube 310. In certain embodiments, a blocker 330 may be inserted in the outer tube 310. The blocker 330 may be made of a ceramic material and blocks the direct path of the infrared energy from the heat lamps 300 to the extraction aperture 111 and the plasma sheath modifier 112. In certain embodiments, a second blocker 335 is disposed behind the heat lamps 300 to block the direct path of infrared energy from the heat lamps 300 to the rear plate 120. This second blocker 335 may also serve to reflect the infrared energy toward the interior of the enclosed volume 101.

Additionally, air or another gas may be flowed through the interior of the outer tube 310 to cool the heat lamps 300. This air may be provided by a blower 185. The blower 185 may be controlled by the controller 190. For example, the blower 185 may be actuated whenever the heater power supply 175 is actuated.

Figure 4:
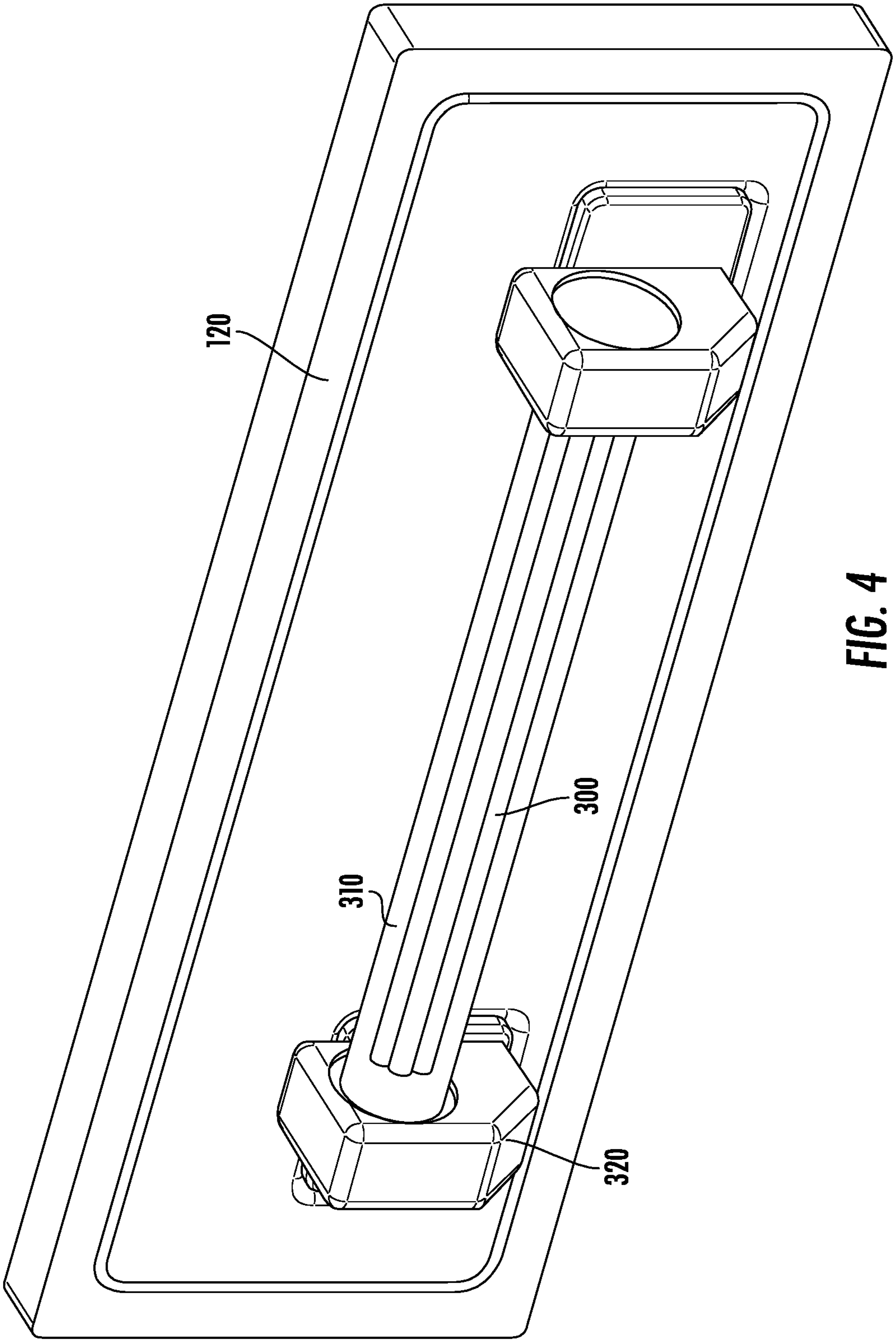
FIG. 4 shows a perspective view of the heater assembly used with the embodiment of FIG. 3.

FIG. 4 shows a detailed illustration of the heater used the ion source chamber of FIG. 3. In this embodiment, the heater 170 comprises a plurality of heat lamps 300 disposed within an outer tube 310. The heat lamps 300 may each comprise a tungsten filament disposed in a glass tube. A halogen gas may also be disposed in the glass tube. When energized, the heat lamps 300 may emit infrared energy at wavelengths between 0 and 10 μm. In certain embodiments, the heat lamps 300 are each capable of providing at least 2 kW of energy. Although not shown, one or more blockers may be disposed in the outer tube 310, as shown in FIG. 3.

In this embodiment, there are two brackets 320 that are attached to the rear plate 120. These two brackets 320 are spaced apart by a distance that is roughly equal to the length of the outer tube 310. In certain embodiments, this may be 10 to 12 inches.

In another embodiment, the two brackets 320 may be connected to a backplate that is then attached to the interior surface of the rear plate 120.

In certain embodiments, the bracket 320 may be constructed from a material that can withstand the conditions within the ion source chamber 100. For example, the brackets 320 may be constructed of anodized aluminum with a coating to resist fluorine and other corrosive components in the plasma environment. The brackets 320 may alternatively be ceramic with a coating.

As seen in FIG. 3, in certain embodiments, the brackets 320 may comprise an interior, isolated from the enclosed volume 101. This interior may include an internal conduit 324 through which the electrical connections 321 from the heater power supply 175 may pass. This may minimize the exposure of the electrical connections 321 to the harsh conditions within the ion source chamber 100. Further, the brackets 320 may be grounded to the rear plate 120. In certain embodiments, the heat lamps 300 are arranged in parallel such that a voltage is supplied to one end of all of the heat lamps 300, while the opposite end of the heat lamps 300 is grounded. In other words, in certain embodiments, a positive voltage from the heater power supply 175 may be provided to one of the two brackets 320 through the internal conduit 324, while a ground connection may be supplied to the second of the two brackets. In certain embodiments, the heat lamps 300 may be independently controlled, such that a separate voltage is applied to each heat lamp 300. In this embodiment, a plurality of electrical connections 321 may pass through the internal conduit 324 to the bracket 320 to allow each heat lamp 300 to be individually powered. To reduce the effect of the RF energy in the plasma, a capacitive filter may be disposed at one or both ends of each heat lamp 300.

In certain embodiments, the brackets 320 may have internal channels 322 through which coolant fluid may pass. This coolant fluid may be deionized water or some other suitable fluid. These internal channels 322 may be in communication with the coolant distribution system 180. The connections for the coolant fluid may also pass through the rear plate 120. This coolant may serve to reduce the temperature of the brackets 320, which in turn reduces the temperature of the heat lamps 300.

In certain embodiments, a fluid conduit 331 extends between the two brackets 320 such that coolant fluid flows from one bracket 320 to the other bracket 320. This fluid conduit 331 may be proximate to the blocker 330 so as to remove heat from the blocker 330. In certain embodiments, a second fluid conduit may be disposed proximate to the second blocker 335. The coolant fluid may flow from the coolant distribution system 180, through the rear plate 120, through the bracket 320 and to the fluid conduit 331.

Additionally, the brackets 320 may also have internal air channels 337 (see FIG. 3) to route air or another gas from the blower 185 to the interior of the outer tube 310. In certain embodiments, the air is blown in on one end of the outer tube 310 to create laminar flow through the outer tube 310. In another embodiment, the air or another gas is blown into both ends of the outer tube 310 to create turbulent flow.

Figure 6:
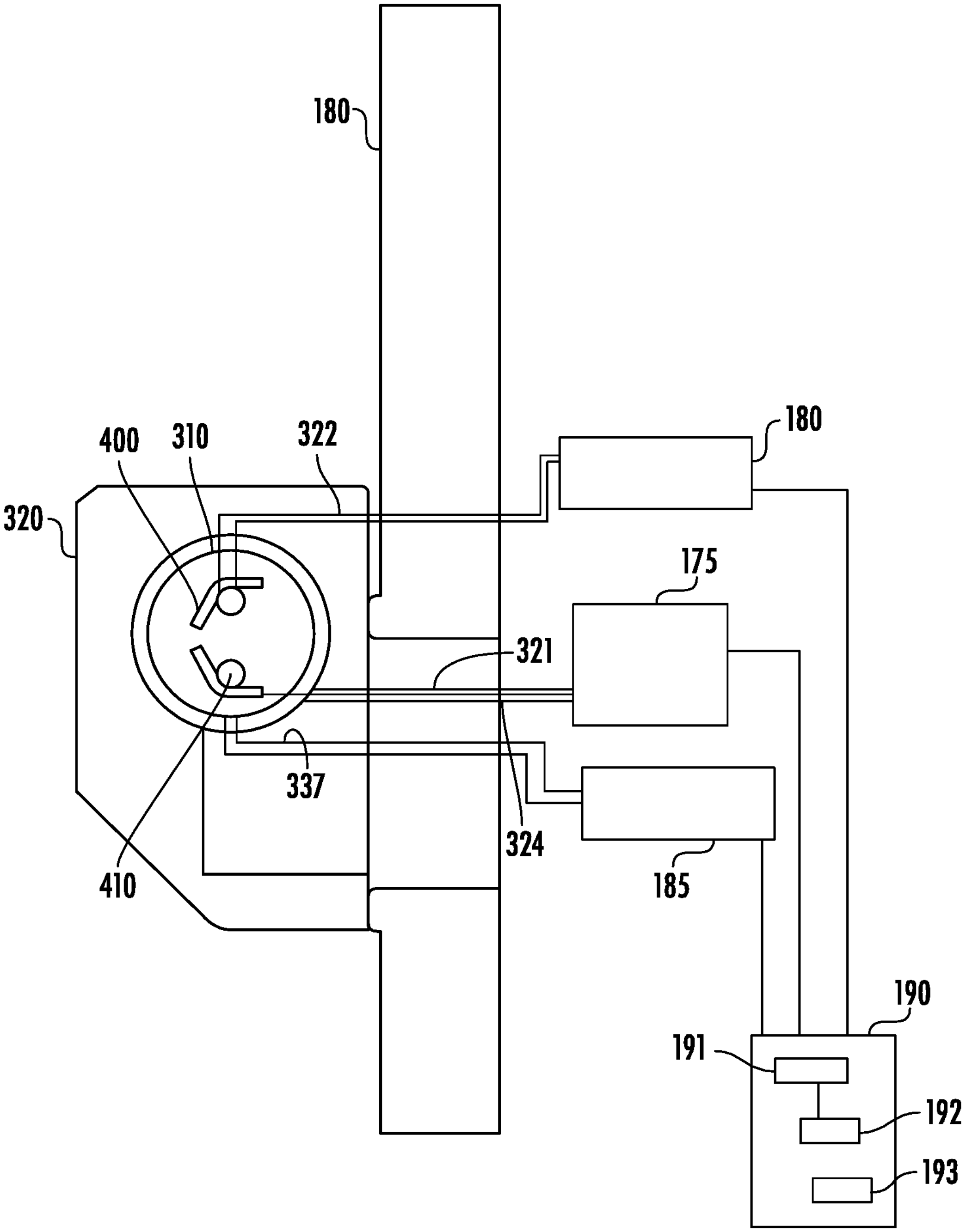
FIG. 6 shows a heater assembly according to another embodiment.

While the previous disclosure describes the use of heat lamps, it is noted that the disclosure is not limited to this embodiment. For example, light emitting diodes (LEDs) may be used in place of the heat lamps. For example, FIG. 6 shows a heater that comprises a plurality of LEDs, which may be configured as one or more LED strips 400. The LEDs may emit energy at one or more wavelengths between 0 μm and 10 μm. The LED strips 400 may comprise one or more rows of LEDs that are arranged on a printed circuit board or other substrate. The LED strips 400 may be disposed in the outer tube 310 so as to protect them from the harsh conditions in the enclosed volume 101.

The LED strips 400 may be angled such that the majority of the infrared energy from the LEDs is directed in a desired direction. For example, as shown in FIG. 6, the LED strips 400 may be angled slightly upward to direct the heat toward the interior surfaces of the enclosed volume 101. Like the heat lamps, power is provided to the LED strips 400 via electrical connections disposed at one or both brackets 320. In certain embodiments, a fluid conduit 410 extends between the two brackets 320 such that coolant fluid flows from one bracket 320 to the other bracket 320. This fluid conduit 410 may be proximate to the LED strip 400 so as to remove heat from the LED strip 400. In certain embodiments, a second fluid conduit may be disposed proximate to a second LED strip. Like the previous embodiment, air or another gas may be flowed through the interior of the outer tube 310 to cool the LED strips 400. This air may be provided by the blower 185. In certain embodiments, because the energy from the LEDs can be directed, blockers may not be employed.

The present system has many advantages. The present ion source chamber helps to alleviate the so-called "first wafer effect". This refers to the condition where wafers are processed before the ion source chamber 100 reaches its optimal temperature. Thus, the first wafer (or first several wafers) are not processed using the same parameters as the rest of the lot. This may represent a negative effect on yield or device performance. The present embedded heater allows the ion source chamber 100 to be heated prior to generating the plasma. Thus, all wafers are uniformly processed.

Additionally, the temperature excursions experienced within the ion source chamber, such as by the liners 160 and other interior components, leads to component fatigue and failure. The embedded heaters allow the temperature within the ion source chamber may be kept at a more constant temperature, which helps achieve longer component life.

Further, the heater allows the temperature in the ion source chamber 100 to be elevated more quickly. Thus, wafer processing may occur sooner. This results in improved throughput.

Finally, the infrared radiation from within the ion source chamber simulates the thermal effects of the RF plasma with respect to the liner while the RF plasma is off. The heater maintains the temperature of the liner at a constant temperature that is unique to specific process parameters. By heating from within, the liner is heated, but the chamber walls are not, this allows the ion source to run to much higher temperatures, such as up to ~300° C., as opposed to a typical process/source chamber ~85 C. By keeping the metal walls cooler than the liner, higher temperatures in the process/source chamber and elastomeric seals can be achieved. Further, the use of an embedded heater allows regulation of the temperature of the source chamber and the liner to be provided separately.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion source chamber, comprising:
- a face plate having an extraction aperture through which ions exit;
- a rear plate, opposite the face plate;
- walls connecting the face plate and the rear plate, the face plate, the rear plate and the walls defining an enclosed volume;
- a heater disposed in the enclosed volume, wherein radiant heat from the heater heats an interior surface of the enclosed volume;
- one or more coils disposed on a portion of an exterior of the walls; and
- an RF power supply in communication with the one or more coils to generate a plasma within the enclosed volume, wherein the enclosed volume that is surrounded by the one or more coils defines a plasma generation region, and the heater is not disposed in the plasma generation region.

2. The ion source chamber of claim 1, wherein the heater comprises one or more heat lamps.

3. The ion source chamber of claim 1, wherein the heater comprises a plurality of LEDs.

4. The ion source chamber of claim 1, further comprising brackets affixed to the rear plate to hold the heater.

5. The ion source chamber of claim 4, further comprising a heater power supply, wherein electrical connections from the heater power supply pass through the rear plate and to the heater.

6. The ion source chamber of claim 4, wherein the brackets comprise an internal channel, and further comprising a coolant distribution system, wherein coolant from the coolant distribution system passes through the rear plate and into the internal channel to cool the brackets.

7. An ion source chamber comprising:

a face plate having an extraction aperture through which ions exit;

a rear plate, opposite the face plate;

walls connecting the face plate and the rear plate, the face plate, the rear plate and the walls defining an enclosed volume;

brackets extending from the rear plate into the enclosed volume;

an outer tube, wherein the outer tube is hollow and disposed between the brackets, and an interior of the outer tube is isolated from the enclosed volume; and a heater disposed in the outer tube, wherein radiant heat from the heater heats an interior surface of the enclosed volume.

8. The ion source chamber of claim 7, wherein the heater comprises one or more heat lamps.

9. The ion source chamber of claim 7, wherein the heater comprises a plurality of LEDs.

10. The ion source chamber of claim 7, wherein the outer tube comprises sapphire or quartz.

11. The ion source chamber of claim 7, further comprising a blower, wherein the brackets comprise internal air channels to route air or another gas from the blower to the interior of the outer tube to cool the heater.

12. The ion source chamber of claim 11, wherein air or another gas is blown into both ends of the outer tube to create turbulent flow.

13. The ion source chamber of claim 7, further comprising a blocker disposed within the outer tube to block a direct path of infrared energy from the heater to the extraction aperture.

14. The ion source chamber of claim 13, further comprising a fluid conduit within the outer tube and extending between the brackets, and a coolant distribution system, where coolant from the coolant distribution system passes through the rear plate and through the fluid conduit within the outer tube.

15. An ion source chamber, comprising:

a face plate having an extraction aperture through which ions exit;

a rear plate, opposite the face plate;

walls connecting the face plate and the rear plate, the face plate, the rear plate and the walls defining an enclosed volume;

brackets extending from the rear plate into the enclosed volume; and a heater disposed between the brackets, wherein the heater emits energy at wavelengths between 0 μm and 10 μm.

16. The ion source chamber of claim 15, further comprising liners disposed in the enclosed volume, the liners having an interior surface facing the enclosed volume and an exterior surface facing the walls, wherein energy from the heater heats the interior surface of the liners.

17. The ion source chamber of claim 15, wherein the heater comprises one or more heat lamps.

18. The ion source chamber of claim 15, wherein the heater comprises a plurality of LEDs.

19. The ion source chamber of claim 18, wherein the plurality of LEDs are angled toward an interior surface of the enclosed volume.

* * * * *